(12) United States Patent
Ahn et al.

(10) Patent No.: US 9,929,229 B2
(45) Date of Patent: Mar. 27, 2018

(54) PROCESS OF MANUFACTURING AN OPEN PATTERN INDUCTOR

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 13/219,459

(22) Filed: Aug. 26, 2011

(65) Prior Publication Data

US 2011/0308072 A1    Dec. 22, 2011

Related U.S. Application Data

(60) Division of application No. 12/120,144, filed on May 13, 2008, now Pat. No. 8,009,006, which is a
(Continued)

(51) Int. Cl.
    *H01F 41/04*        (2006.01)
    *H01F 17/00*        (2006.01)
(Continued)

(52) U.S. Cl.
    CPC .......... *H01L 28/10* (2013.01); *H01F 17/0013* (2013.01); *H01F 41/043* (2013.01);
(Continued)

(58) Field of Classification Search
    CPC .. H01F 17/0013; H01F 41/043; H01F 41/046; H01L 27/08; H01L 27/10;
(Continued)

(56) References Cited

U.S. PATENT DOCUMENTS

| 3,765,082 A | 10/1973 | Zyetz |
| 3,798,059 A | 3/1974 | Astle et al. |

(Continued)

FOREIGN PATENT DOCUMENTS

| JP | 06089812 A | * | 3/1994 |
| JP | 09205178 A | * | 8/1997 |
| JP | 09-246806 | | 9/1997 |

OTHER PUBLICATIONS

American Society for Metals, "Metals Handbook", Desk Edition, Second Edition, Metals Park, Ohio : American Society for Metals, (1998), 642-643.

(Continued)

*Primary Examiner* — A. Dexter Tugbang
(74) *Attorney, Agent, or Firm* — Schwegman Lundberg & Woessner, P.A.

(57) ABSTRACT

Various embodiments includes a stacked open pattern inductor fabricated above a semiconductor substrate. The stacked open pattern inductor includes a plurality of parallel open conducting patterns embedded in a magnetic oxide or in an insulator and a magnetic material. A layer of magnetic material may be located above the inductor and below the inductor to confine electronic noise generated in the stacked open pattern inductor to the area occupied by the inductor. The stacked open pattern inductor may include a magnetic material directly contacts one of the conducting patterns and the substrate. The stacked open pattern inductor may be fabricated using conventional integrated circuit manufacturing processes, and the inductor may be used in connection with computer systems.

16 Claims, 6 Drawing Sheets

Related U.S. Application Data continuation of application No. 10/722,094, filed on Nov. 25, 2003, now Pat. No. 7,380,328, which is a division of application No. 10/280,180, filed on Oct. 25, 2002, now Pat. No. 6,653,196, which is a division of application No. 09/261,595, filed on Feb. 26, 1999, now Pat. No. 6,566,731.

(51) Int. Cl.
| | |
|---|---|
| H01L 49/02 | (2006.01) |
| H01L 27/08 | (2006.01) |
| H01P 11/00 | (2006.01) |
| H01P 9/02 | (2006.01) |
| H01F 27/36 | (2006.01) |

(52) U.S. Cl.
CPC ........ *H01F 41/046* (2013.01); *H01L 27/08* (2013.01); *H01F 27/365* (2013.01); *H01P 9/02* (2013.01); *H01P 11/007* (2013.01); *Y10T 29/4902* (2015.01); *Y10T 29/4906* (2015.01); *Y10T 29/49062* (2015.01); *Y10T 29/49069* (2015.01); *Y10T 29/49071* (2015.01); *Y10T 29/49073* (2015.01); *Y10T 29/49075* (2015.01)

(58) Field of Classification Search
CPC ... H01L 27/365; H01L 28/10; Y10T 29/4902; Y10T 29/4906; Y10T 29/49062; Y10T 29/49073; Y10T 29/49069; Y10T 29/49071; Y10T 29/49075; H01P 9/02; H01P 11/007
USPC ........ 29/602.1, 603.23, 603.24, 603.25, 607, 29/609; 336/200, 223, 232, 234
See application file for complete search history.

(56) References Cited

U.S. PATENT DOCUMENTS

| | | | |
|---|---|---|---|
| 3,812,442 A | | 5/1974 | Muckelroy |
| 3,785,046 A | | 6/1974 | Jennings |
| 4,543,553 A | | 9/1985 | Mandai et al. |
| 4,689,594 A | | 8/1987 | Kawabata et al. |
| 4,729,510 A | * | 3/1988 | Landis ............... H01P 9/02 174/250 |
| 4,845,452 A | * | 7/1989 | Sasaki et al. ............... 336/200 |
| 4,873,757 A | * | 10/1989 | Williams ............ H01F 17/0013 29/602.1 |
| 4,959,631 A | | 9/1990 | Hasegawa et al. |
| 5,032,815 A | | 7/1991 | Kobayashi et al. |
| 5,070,317 A | | 12/1991 | Bhagat |
| 5,095,357 A | | 3/1992 | Andoh et al. |
| 5,122,227 A | | 6/1992 | Ott |
| 5,227,659 A | | 7/1993 | Hubbard |
| 5,302,932 A | | 4/1994 | Person et al. |
| 5,349,743 A | | 9/1994 | Grader et al. |
| 5,370,766 A | | 12/1994 | Desaigoudar et al. |
| 5,387,551 A | | 2/1995 | Mizoguchi et al. |
| 5,476,728 A | | 12/1995 | Nakano et al. |
| 5,515,022 A | * | 5/1996 | Tashiro et al. ...... H01F 17/0013 |
| 5,576,680 A | * | 11/1996 | Ling .................. H01F 41/046 257/E21.022 |
| 5,583,424 A | | 12/1996 | Sato et al. |
| 5,583,474 A | | 12/1996 | Mizoguchi et al. |
| 5,602,517 A | | 2/1997 | Kaneko et al. |
| 5,610,433 A | | 3/1997 | Merrill et al. |
| 5,612,660 A | | 3/1997 | Takimoto |
| 5,643,804 A | | 6/1997 | Arai et al. |
| 5,656,101 A | | 8/1997 | Hayakawa et al. |
| 5,788,854 A | | 8/1998 | Desaigoudar et al. |
| 5,801,521 A | | 9/1998 | Mizoguchi et al. |
| 5,821,846 A | | 10/1998 | Leigh et al. |
| 5,831,331 A | | 11/1998 | Lee |
| 5,844,451 A | | 12/1998 | Murphy |
| 5,945,902 A | | 8/1999 | Lipkes et al. |
| 6,052,790 A | | 4/2000 | Brown |
| 6,107,907 A | | 8/2000 | Leigh et al. |
| 6,233,834 B1 | | 5/2001 | Walsh |
| 6,320,376 B1 | | 11/2001 | Tamaki et al. |
| 6,326,314 B1 | | 12/2001 | Merrill et al. |
| 6,356,181 B1 | | 3/2002 | Kitamura |
| 6,404,317 B1 | | 6/2002 | Mizoguchi et al. |
| 6,429,632 B1 | | 8/2002 | Forbes et al. |
| 6,448,879 B1 | | 9/2002 | Kitamura |
| 6,566,731 B2 | | 5/2003 | Ahn et al. |
| 6,653,196 B2 | | 11/2003 | Ahn et al. |
| 7,091,575 B2 | | 8/2006 | Ahn et al. |
| 7,262,482 B2 | | 8/2007 | Ahn et al. |
| 7,380,328 B2 | | 6/2008 | Ahn et al. |
| 8,009,006 B2 | | 8/2011 | Ahn et al. |
| 2006/0012007 A1 | | 1/2006 | Ahn et al. |
| 2008/0246578 A1 | | 10/2008 | Ahn et al. |

OTHER PUBLICATIONS

Dhara, S, et al., "Direct Deposit of highly coercive gamma iron oxide thin films for magnetic recording", Journal of Applied Physics, 74(11), (Dec. 1993), 7019-7021.

Dimitrov, D. V., et al., "Stoichiometry and Magnetic Properties of Iron Oxide Films", Materials Research Society Symposium Proceedings, 494, (1998), pp. 89-94.

Domke, M., et al., "Magnetic and electronic properties of thin iron oxide films", Surface Science, 126,, (Mar. 1983), pp. 727-732.

Fujii, E, et al., "Low-temperature preparation and properties of spinel-type iron oxide films by ECR plasma-enhanced metalorganic chemical vapor deposition", Japanese Journal of Applied Physics, 32(10B),, (Oct. 1993), pp. 1527-1529.

Itoh, T., et al., "Ferrite plating of Ba-containing iron oxide films using chelated highly alkaline (pH equals 11-13) aqueous solutions", Japanese Journal of Applied Physics, 34(3), , (Mar. 1995), pp. 1534-1536.

Joshi, S., et al., "Pulsed laser deposition of iron oxide and ferrite flms", Journal of Applied Physics, 64(10), Abstract—Fourth Joint Magnetism and Magnetic Materials—INTERMAG Conference Vancouver, BC, (Nov. 15, 1988), 5647-5649.

Kaito, C., et al., "Structure of iron oxide films prepared by evaporating various iron oxide powders", Applications of Surface Science, 22/23, North-Holland, Amsterdam, (1985), pp. 621-630.

Kim, Y J., et al., "Surface Micromachined Solenoid Inductors for High Frequency Applications", 1997 International Symposium on Microelectronics,, (1997), 1-6.

Li, J. L., et al., "Preparation of amorphous iron-containing and crystalline iron oxide films by glow discharge and their properties", Material Science & Engineering, B7, , (Sep. 1990), pp. 5-13.

Lin, J. K., et al., "Properties of RF Sputtered Iron Oxide Thin Films with CoCr and Nb as Dopants", IEEE Transactions on Magnetics, vol. MAG-21, No. 5,, (Sep. 1985), 1-3 p.

Macchesney, J. B., et al., "Chemical vapor deposition of iron oxide films for use as semitransparent masks", Journal of the Electrochemical Society, 118(5), , (May 1971), pp. 776-781.

Ouchi, H., et al., "High rate deposition of iron-oxide thin films by reactive sputtering", IEEE Transactions on Magnetics, vol. MAG-19, No. 5, , (Sep. 1983), pp. 1980-1982.

Ouyang, M., et al., "Structure and Magnetic Properties of Iron Oxide Films Deposited by Excimer Laser Ablation of a Metal-Containing Polymer", Material Research Bulletin, 32(8),, (1997), pp. 1099-1107.

Park, J. Y., et al., "Ferrite-Based Integrated Planar Inductor and Transformers Fabricated at Low Temperature", IEEE Transactions on Magnetics, 33(5), , (Sep. 1997), pp. 3322-3324.

Park, J. Y., et al., "Fully Integrated Micromachined Inductors with Electroplated Anisotropic Magnetic Cores", Thirteenth Annual Applied Power Electronics Conference and Exposition, vol. 1, Conference Proceedings, Anaheim, California, (1998), 379-385.

Shigematsu, T., et al., "Magnetic properties of amorphous iron (III) oxide thin films", Journal de Physique Colloque, International Conference on the Applications of the Mossbauer Effect, Kyoto, Japan, (Mar. 1979), pp. 153-154.

(56) References Cited

OTHER PUBLICATIONS

Zheng, Y., et al., "Structure and magnetic properties of sputtered iron oxide films", Proceedings of the International Symposium on Physics of Magnetic Materials, , (1987), pp. 146-149.

Zuffada, C., et al., "Modeling Radiation with an Efficient Hybrid Finite-Element Integral-Equation Waveguide Mode-Matching Technique", Antennas and Propagation, IEEE, 45 (1), (Jan. 1997), 34-39.

\* cited by examiner

PROCESS OF MANUFACTURING AN OPEN PATTERN INDUCTOR

PRIORITY APPLICATIONS

This application is a divisional of U.S. application Ser. No. 12/120,144, filed May 13, 2008, now issued as U.S. Pat. No. 8,009,006, which is a continuation of U.S. application Ser. No. 10/722,094 filed Nov. 25, 2003, now issued as U.S. Pat. No. 7,380,328, which is a divisional of U.S. application Ser. No. 10/280,180 filed Oct. 25, 2002, now issued as U.S. Pat. No. 6,653,196, which is a divisional of U.S. application Ser. No. 09/261,595 filed on Feb. 26, 1999, now issued as U.S. Pat. No. 6,566,731, the specification of these applications are incorporated herein by reference in their entirety.

FIELD

The present invention relates to inductors, and more particularly, to inductors used in integrated circuits.

BACKGROUND

The telecommunications and computer industries are driving the demand for miniaturized analog and mixed signal circuits. Inductors are a critical component in the traditional discrete element circuits, such as impedance matching circuits, resonant tank circuits, linear filters, and power circuits, used in these industries. Since traditional inductors are bulky components, successful integration of the traditional discrete element circuits requires the development of miniaturized inductors.

One approach to miniaturizing an inductor is to use standard integrated circuit building blocks, such as resistors, capacitors, and active circuitry, such as operational amplifiers, to design an active inductor that simulates the electrical properties of a discrete inductor. Active inductors can be designed to have a high inductance and a high Q factor, but inductors fabricated using these designs consume a great deal of power and generate noise.

A second approach to miniaturizing an inductor is to fabricate a solenoid type inductor with a core using conventional integrated circuit manufacturing process technology. Unfortunately, conventional integrated circuit process steps do not lend themselves to precisely and inexpensively fabricating a helical structure with a core. So, integrated circuit process technology is only marginally compatible with manufacturing a solenoid type inductor.

A third approach, sometimes used in the fabrication of miniature inductors in gallium arsenide circuits, is to fabricate a spiral type inductor using conventional integrated circuit processes. Unfortunately, this approach has a high cost factor associated with it when applied to fabricating inductors for use in silicon integrated circuits. Silicon integrated circuits operate at lower frequencies than gallium arsenide circuits, and generally require inductors having a higher inductance than inductors used in gallium arsenide circuits. The higher inductance is realized in a spiral inductor occupying a large surface area on the silicon substrate.

For these and other reasons there is a need for the present invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Inductors intended for use in circuits fabricated on a silicon substrate usually operate at lower frequencies and require larger inductances than inductors intended for use in circuits fabricated on a gallium arsenide substrate. As mentioned above, a larger inductance is usually realized in silicon by having the inductor occupy a larger surface area. According to one embodiment of the present invention, rather than increasing the inductance by increasing the surface area occupied by the inductor, a larger inductance is achieved by encapsulating an inductor in a magnetic material.

Figure 1A:
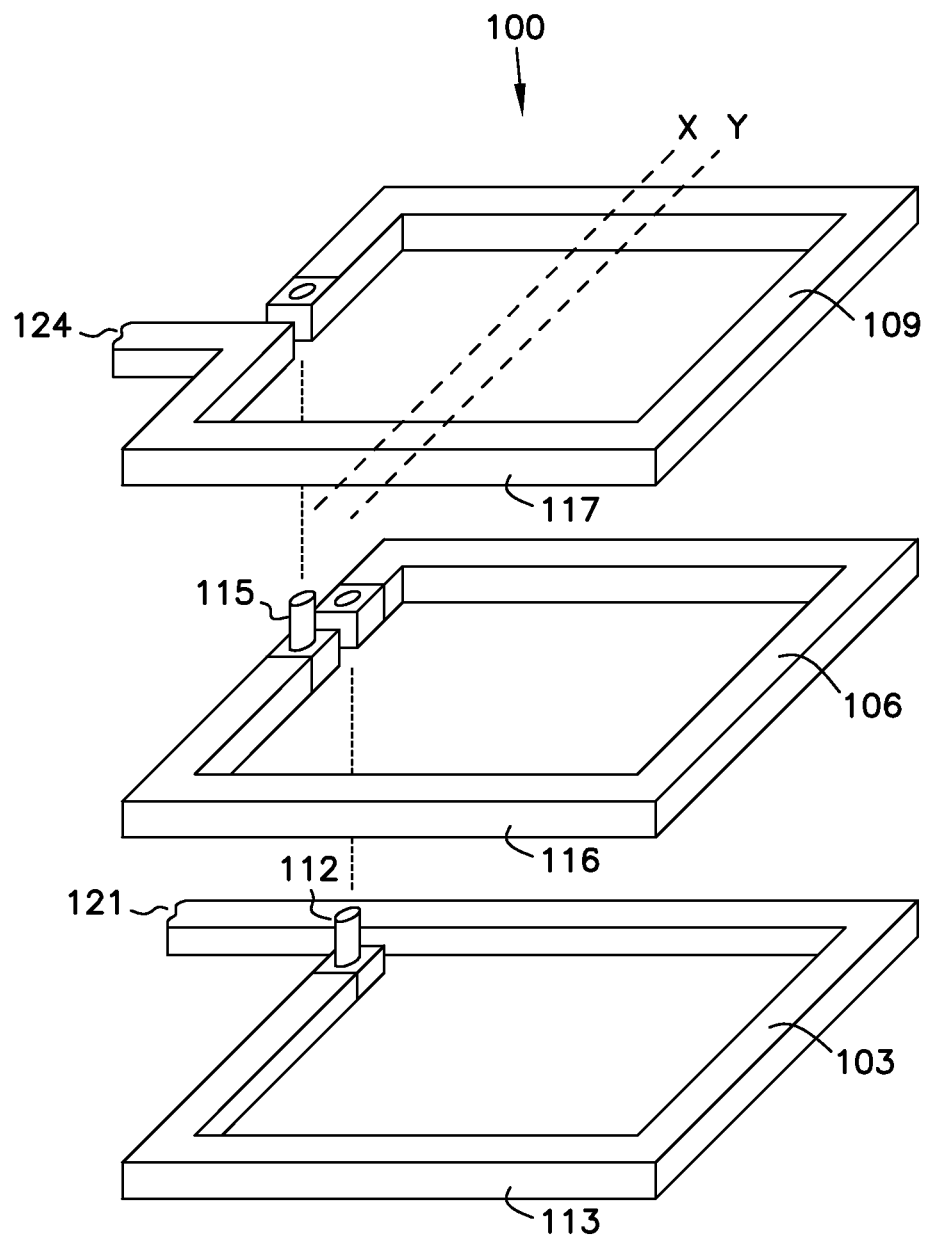
FIG. 1A is a perspective view of a stacked open pattern inductor.

Referring to FIG. 1A, a perspective view of the conductive elements of one embodiment of open pattern stacked inductor 100 is shown. Open pattern stacked inductor 100 is made up of three vertically stacked open conductive patterns 103, 106, and 109 coupled together by conductive segments 112 and 115. Open conductive patterns 103, 106, and 109 each have an outside edge 113, 116, and 117, respectively.

Figure 1B:
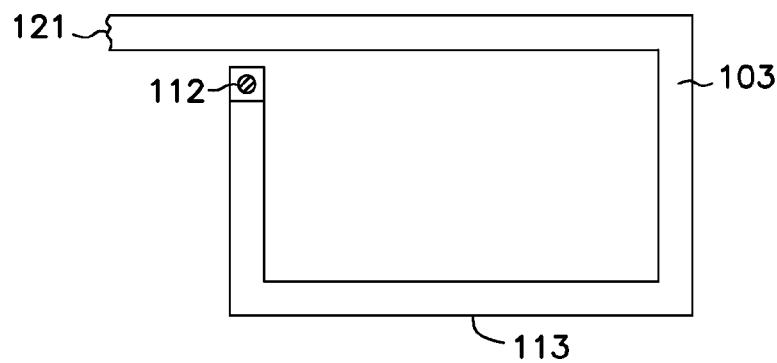
FIG. 1B is a top view of the lower open conductive pattern of the stacked open pattern inductor of FIG. 1A.
Figure 1C:
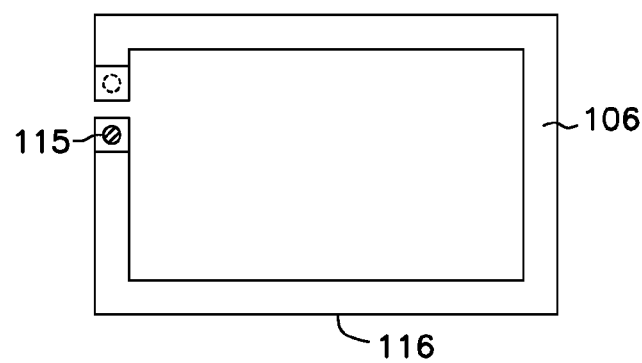
FIG. 1C is a top view of the middle open conductive pattern of the stacked open pattern inductor of FIG. 1A.
Figure 1D:
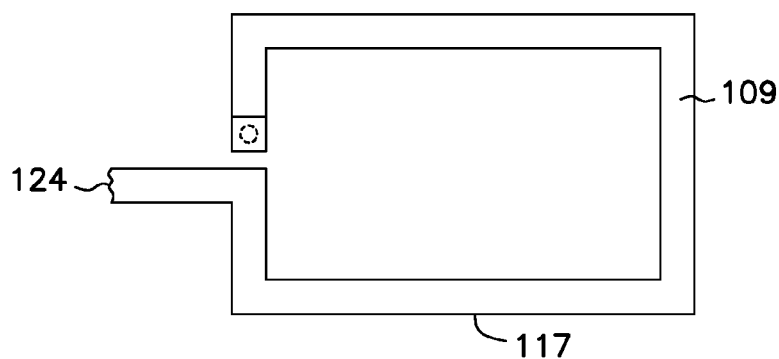
FIG. 1D is a top view of the upper open conductive pattern of the stacked open pattern inductor of FIG. 1A.

FIGS. 1B, 1C, and 1D show a top view of each open conductive pattern of FIG. 1A. FIG. 1B shows a top view of open conductive pattern 103. FIG. 1C shows a top view of open conductive pattern 106. FIG. 1D shows a top view of open conductive pattern 109.

In the embodiment shown in FIG. 1A, each of the three open conductive patterns is an open rectangle. However, the present invention is not limited to a particular open pattern shape. Any shape or shapes that can be combined to form a device in which the voltage across the device is proportional to the derivative of the current passing through the device is suitable for use in connection with the present invention.

Referring to FIG. 1B, open conductive pattern 103 is fabricated from a conductive material. In one embodiment, open conductive pattern 103 is fabricated from copper. In alternate embodiments, open conductor 103 is fabricated from gold, aluminum, silver, or an alloy of copper, gold, aluminum or silver. However, the fabrication of open conductive pattern 103 is not limited to a particular material. Any material that is capable of conducting current is suitable for use in connection with the present invention.

Open conductive pattern 103 has a cross-sectional area. As the cross-sectional area decreases, the resistance increases, and the current carrying capacity of open conductive pattern 103 decreases. So, the cross-sectional area of open conductive pattern 103 is selected to ensure that open conductive pattern 103 is capable of carrying the anticipated operating current.

Open conductive pattern 103, as shown in FIG. 1A, is coupled to open conductive pattern 106 by conductive segment 112, which is perpendicular to open conductive pattern 103 and open conductive pattern 106, in one embodiment. Conductive segment 112 is fabricated from a conductive material, such as gold, silver, copper, aluminum, aluminum-copper, or an alloy of such a conductive material. Conductive segment 112 has a cross-sectional area. The cross-sectional area is selected to ensure that conductive segment 112 has a current carrying capacity sufficient to carry the anticipated current in open stacked inductor 100.

Referring to FIG. 1C, open conductive pattern 106 is fabricated from a conductive material. In one embodiment, open conductive pattern 106 is fabricated from copper. In alternate embodiments, open conductor 106 is fabricated from gold, aluminum, silver, or an alloy of copper, gold, aluminum or silver. However, the fabrication of open conductor 106 is not limited to a particular material. Any material that is capable of conducting current is suitable for use in connection with the present invention. In addition, open conductive pattern 106 may be fabricated from a different conductor than open conductive pattern 103 or open conductive pattern 109. For example, open conductive pattern 103 can be fabricated from gold, while open conductive pattern 106 is fabricated from copper.

Open conductive pattern 106 has a cross-sectional area. As the cross-sectional area decreases, the resistance increases, and the current carrying capacity of open conductive pattern 106 decreases. So, the cross-sectional area of open conductive pattern conductor 106 is selected to ensure that open conductive pattern 106 is capable of carrying the anticipated operating current.

Open conductive pattern 106, as shown in FIG. 1C, is coupled to open conductive pattern 109 by conductive segment 115. Conductive segment 115 is fabricated from a conductive material, such as gold, silver, copper, aluminum, aluminum-copper, or an alloy of such a conductive material. Conductive segment 115 has a cross-sectional area. The cross-sectional area is selected to ensure that conductive segment 115 has a current carrying capacity sufficient to carry the operating current in open stacked inductor 100.

Referring to FIG. 1D, open conductive pattern 109 is fabricated from a conductive material. In one embodiment, open conductive pattern 109 is fabricated from copper. In alternate embodiments, open conductive pattern 109 is fabricated from gold, aluminum, silver, or an alloy of copper, gold, aluminum or silver. However, the fabrication of open conductive pattern 109 is not limited to a particular material. Any material that is capable of conducting current is suitable for use in connection with the present invention.

Open conductive pattern 109 has a cross-sectional area. As the cross-sectional area decreases, the resistance increases, and the current carrying capacity of open conductive pattern 109 decreases. So, the cross-sectional area of open conductor 109 is selected to ensure that open conductive pattern 109 is capable of carrying the anticipated operating current.

As described briefly above, in a stacked open conductor inductor, each open conductive pattern can be fabricated from a different material. For example, open conductor pattern 103 can be fabricated from aluminum, open conductor pattern 106 can be fabricated from copper, and open conductor pattern 109 can be fabricated from gold. This provides a flexible environment for an inductor designer. In this environment, the designer can carefully control the heat generated by open pattern inductor 100, shown in FIG. 1A, by incorporating higher conductivity materials into sections of the inductor. In addition, the designer can control the location of a particular material in relation to the substrate. For example, copper, which may require a barrier layer to protect a substrate from copper migration, can be located sufficiently far from the substrate so that a barrier layer is not required.

FIGS. 2A-2D illustrate the fabrication of integrated stacked open pattern inductor 200 on a substrate 203. Stacked open pattern inductor 100 of FIG. 1A is included in stacked open pattern inductor 200.

Figure 2A:
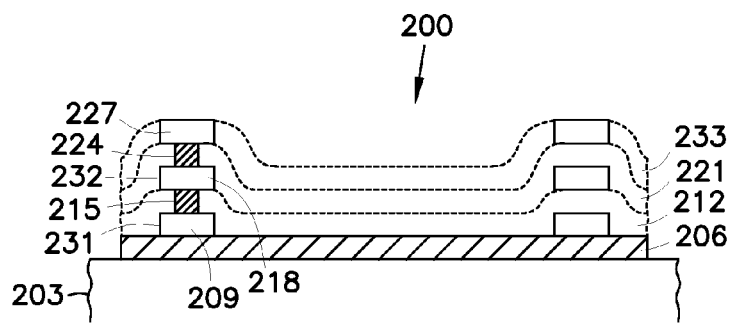
FIG. 2A is a side view of a slice of the stacked open pattern inductor of FIG. 1A taken between the lines X and Y and encapsulated in a magnetic oxide.

FIG. 2A shows a side view of a cross-sectional slice of one embodiment of integrated stacked open pattern inductor 200. Inductor 200 comprises substrate 203, magnetic material layer 206, open inductor pattern 209, magnetic material 212, conductive segment 215, open inductor pattern 218, magnetic material layer 221, conductive segment 224, open inductor pattern 227, and magnetic material layer 233. Open inductor pattern 209 and open inductor pattern 218 have outside edges 231, and 232, respectively.

Magnetic material layer 206 is deposited on substrate 203, open inductor pattern 209 is deposited on magnetic material layer 206, magnetic material layer 212 is deposited above magnetic material layer 206, open inductor pattern 218 is deposited on magnetic material layer 212, magnetic material layer 221 is deposited above magnetic material layer 212, open inductor pattern 227 is deposited on magnetic material layer 221, and magnetic material layer 233 is deposited above magnetic material layer 221.

Substrate 203 is preferably a semiconductor, such as silicon. Alternatively, substrate 203 is gallium arsenide, germanium, or some other substrate material suitable for use in the manufacturing of integrated circuits.

Magnetic material layer 206 is deposited on the surface of substrate 203. Magnetic material layers 212, 221, and 233 are deposited to fill the interior area of open conductors 209, 218, and 227. Filling the interior area of open conductors 209, 218, and 227 with a magnetic material increases the inductance of open pattern inductor 200. The particular type of the magnetic material selected for use in a particular inductor design depends on the inductance requirement.

Magnetic material layer 206, in one embodiment, extends beyond outside edge 231 of open conductive pattern 231. One advantage of extending magnetic material layer 206 beyond outside edge 231 of open conductive pattern 209 is that the magnetic flux generated by inductor 200 can be confined to the area occupied by inductor 200. In an alternate embodiment, each magnetic material layer 212, 221, and 233 can be extended beyond outside edge 231 of open conductive pattern 209. The amount of the extension is selected based on the anticipated current in inductor 200 and the magnetic permeability of magnetic material layers 212, 221, and 233. In one embodiment, the extension is less than about a millimeter, and in other embodiments the extension is less than one-half millimeter or one-tenth millimeter.

Figure 2B:
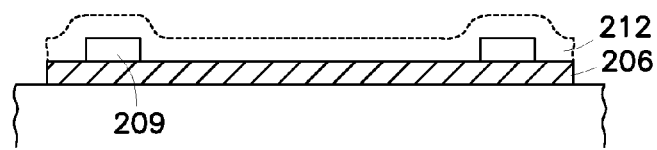
FIG. 2B is a section of FIG. 1A showing the lower encapsulated open inductor pattern of FIG. 1A.
Figure 2C:
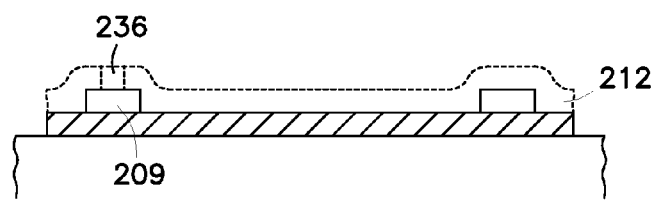
FIG. 2C is a section of FIG. 1A showing the a contact site exposing the lower open inductor pattern.
Figure 2D:
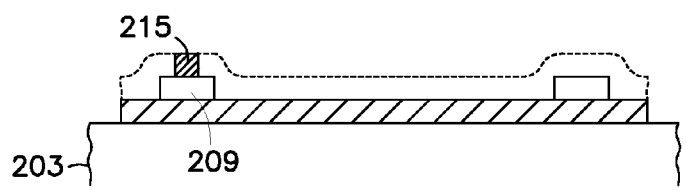
FIG. 2D is a section of FIG. 1A showing the contact site filled with a conductive material.

FIGS. 2B-2D show a sequence of operations for forming part of inductor 200 shown in FIG. 2A. Referring to FIG. 2B, open inductor pattern 209 is deposited above magnetic material layer 206. The description of open inductor pattern 103 of FIG. 1A provided above also applies to open inductor pattern 209. Magnetic oxide layer 212 is deposited above magnetic material layer 206 and encapsulates open inductor pattern 209.

Referring to FIG. 2B, contact hole 236 is etched in magnetic oxide layer 212 to expose open inductor pattern 209. Any etching process capable of etching contact holes in magnetic oxide layer 212 is suitable for use in connection with the present invention.

Referring to FIG. 2D, contact hole 236, shown in FIG. 2C, is filled with a conductive material to form conductive segment 215, which couples open inductor pattern 209 to open inductor pattern 218, shown in FIG. 2A.

The description of FIGS. 2B-2D provided above can be summarized. The operations include depositing an open inductor pattern 209, depositing an encapsulating magnetic oxide 212, etching a contact hole 236, and depositing a conductive segment 215. Repeating the above described operations or a subset of the above described operations to create a sandwich structure by stacking one or more open inductor patterns, one or more layers of magnetic oxide, and one or more conductive segments above open inductor pattern 209 increases the inductance of inductor 200.

Figure 3A:
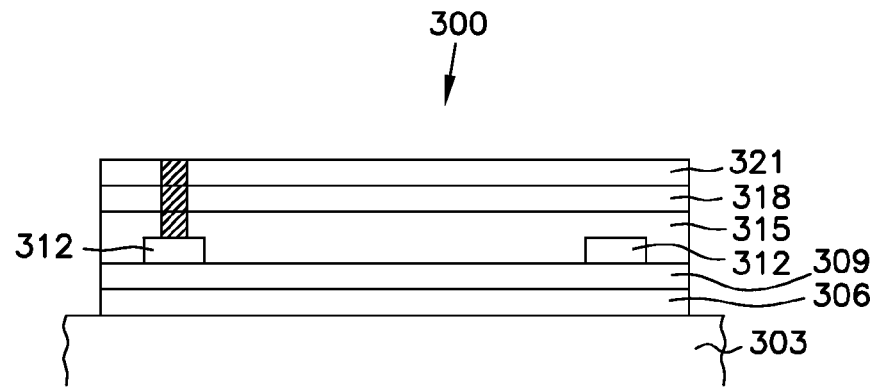
FIG. 3A is a side view of a slice of FIG. 1A taken between lines X and Y showing the lower open inductor pattern embedded in an insulator and a magnetic material.

Referring to FIG. 3A, a side view of a cross-sectional slice of an alternate embodiment of a rectangular open pattern inductor 300 is shown. Inductor 300 is formed on substrate 303 and comprises magnetic material layer 306, insulating layer 309, rectangular open inductor pattern 312, second insulating layer 315, second magnetic material layer 318, and third insulating layer 321.

Magnetic material layer 306 is deposited on substrate 303, insulating layer 309 is deposited on magnetic material layer 306, rectangular open inductor pattern 312 is deposited on insulating layer 309, second insulating layer 315 is deposited on rectangular open inductor pattern 312, and second magnetic material layer 318 is deposited on second insulating layer 315.

Substrate 303, in one embodiment, is a semiconductor. Silicon is preferred, but the substrate 303 is not limited to a particular type of material. Germanium, gallium arsenide, and silicon-on-sapphire are all materials suitable for use as a substrate in the present invention.

Magnetic material layer 306, in one embodiment, is deposited on the surface of substrate 303. The particular magnetic material selected for use in a particular inductor design depends on the inductance requirement. In one embodiment, in which a large inductance in a small volume is desired, a high permeability ferromagnetic material, such as pure iron or a NiFe alloy is selected. An example of a high permeability NiFe alloy is an alloy of 81% Ni and 19% Fe.

Insulating layer 309 is deposited on magnetic material layer 306. In one embodiment, insulating layer 309 is an inorganic silicon oxide film. In an alternate embodiment, insulating layer 309 is silicon dioxide. In still another embodiment, which is perhaps preferable in a low tempera- ture processing environment, insulating layer 309 is an organic insulator, such as parylene and polyimide.

Rectangular open inductor pattern 312 is deposited on insulating layer 309. In an alternate embodiment, open inductor pattern 312 is an open circle. In a second alternate embodiment, inductor pattern 312 is a open polygon, where the open polygon may be in the shape of a triangle, square, rectangle, octagon, or hexagon. A rectangular open inductor pattern, which is shown as inductor pattern 312 in FIG. 3A, is preferred, since it is easy to manufacture. Inductor pattern 312 is fabricated from a high-conductivity material. In one embodiment, the high-conductivity material is gold. In an alternate embodiment, the high-conductivity material is copper.

Referring to FIG. 3A, second insulating layer 315 is deposited on inductor pattern 312, and is fabricated from the same materials as insulating layer 309.

Second magnetic material layer 318 is deposited on second insulating layer 315, and is fabricated from the same materials as magnetic material layer 306. Second magnetic material layer 306 is preferably located above inductor pattern 312, and second magnetic material layer 318 does not intersect the plane of magnetic material layer 306.

The contribution of the magnetic material layer 306 to the inductance of inductor 300 can be precisely controlled during the manufacturing process. The thickness of the layer of magnetic material along with the magnetic properties of the material define the contribution of the layer to the inductance of the inductor. Once the properties of the material are established during the preparation of the material, the thickness of the layer, which can be precisely controlled in an integrated circuit manufacturing process, defines the contribution of the layer of magnetic material to the inductance.

Figure 3B:
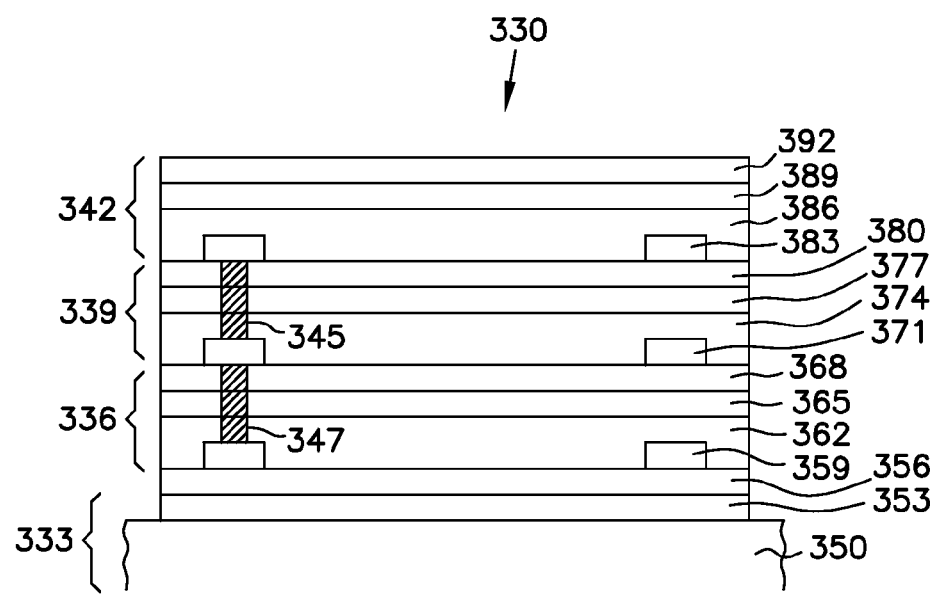
FIG. 3B is a side view of a slice of FIG. 2A taken between lines X and Y showing the open inductor embedded in insulating layers and magnetic material layers.

Referring to FIG. 3B, three open inductor patterns are stacked to form inductor 330. Inductor 330 comprises base structure 333, sandwich structure 336, second sandwich structure 339, third sandwich structure 342, and conductive paths 345 and 347. Base structure 333 includes substrate 350, magnetic material layer 353, and insulating layer 356. Sandwich structure 336 includes open inductor pattern 359, insulating layer 362, magnetic material layer 365, and insulating layer 368. Second sandwich structure 339 is stacked on sandwich structure 336. Second sandwich structure 339 includes open inductor pattern 371, insulating layer 374, magnetic material layer 377, and insulating layer 380. Third sandwich structure 342 includes open inductor pattern 383, insulating layer 386, magnetic material layer 389, and insulating layer 392.

Conductive path 347 couples sandwich structure 336 to second sandwich structure 339, and serially connects open inductor pattern 359 to inductor pattern 371. A current flowing in the serially connected inductor patterns creates a reinforcing magnetic field in magnetic material layer 365. Magnetic material layers 353 and 389 are located below inductor pattern 359 and above inductor pattern 383, respectively. Magnetic material layers 353 and 389 confine the magnetic flux and noise radiated by a current flowing in inductor patterns 359, 368, and 383 to the area bounded by the outer surfaces of magnetic material layers 353 and 389. By stacking sandwich structures, in one embodiment, a large inductance can be created without increasing the surface area on a substrate occupied by the inductor.

The inductor of the present invention can be connected to other electronic devices in an integrated circuit. The inductor of the present invention is compatible with conventional silicon manufacturing processes, and structures for coupling passive devices, such as inductors, to other integrated circuit devices are known in the art.

Figure 4:
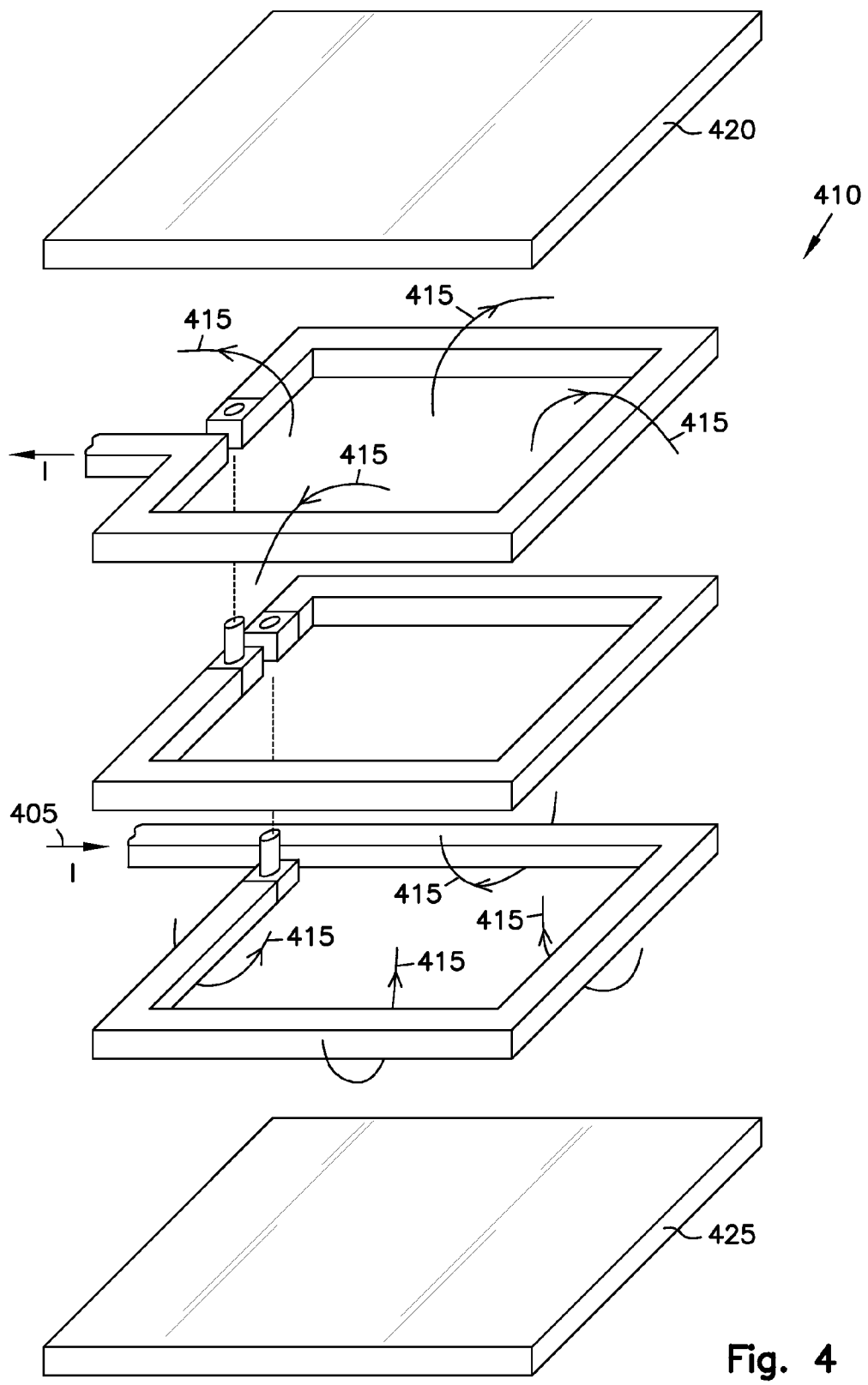
FIG. 4 is an exploded perspective view of a stacked open inductor showing magnetic field lines.

Referring to FIG. 4, a diagram showing the currents and the resulting reinforcing magnetic fields of the three open inductor sandwich of FIG. 3B is shown. Current 405 flows in stacked inductor 410. The resulting magnetic field lines 415 are shown as confined by magnetic material barrier layers 420 and 425.

Figure 5:
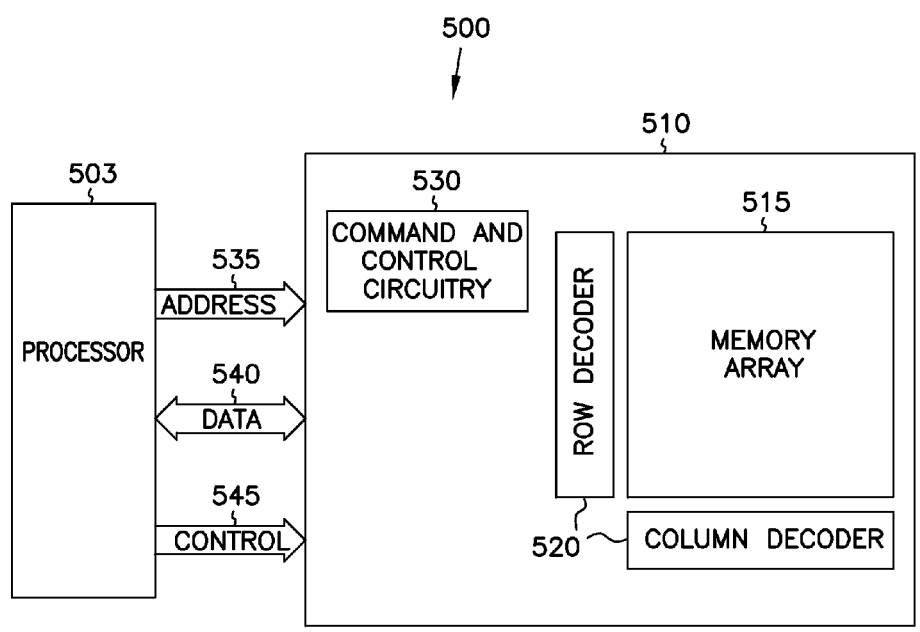
FIG. 5 is a block diagram of a computer system suitable for use in connection with the present invention.

Referring to FIG. 5, a block diagram of a system level embodiment of the present invention is shown. System 500 comprises processor 505 including a motherboard and memory device 510, which includes memory cells and circuits including inductors of one or more of the types described above in conjunction with FIGS. 1-4. Memory device 510 comprises memory array 515, address circuitry 520, and read circuitry 530, and is coupled to processor 505 by address bus 535, data bus 540, and control bus 545. Memory device 510 is typically mounted on a motherboard. Processor 505, through address bus 535, data bus 540, and control bus 545 communicates with memory device 510. In a read operation initiated by processor 505, address information, data information, and control information are provided to memory device 510 through busses 535, 540, and 545. This information is decoded by addressing circuitry 520, including a row decoder and a column decoder, and read circuitry 530. Successful completion of the read operation results in information from memory array 515 being communicated to processor 505 over data bus 540.

CONCLUSION

Various embodiments solve many of the problems listed above and others which will become known to those skilled in the art upon reading and understanding the present disclosure. Some embodiments include a stacked open pattern inductor fabricated above a semiconductor substrate. The stacked open pattern inductor includes a plurality of parallel open conductive patterns embedded in a magnetic oxide or an insulator and a magnetic material. Embedding the stacked open pattern inductor in a magnetic oxide or in an insulator and a magnetic material increases the inductance of the inductor and allows the magnetic flux to be confined to the area of the inductor. A layer of magnetic material may be located above the inductor and below the inductor to confine electronic noise generated in the stacked open pattern inductor to the area occupied by the inductor. The stacked open pattern inductor may be fabricated using conventional integrated circuit manufacturing processes, and the inductor may be used in connection with computer systems.

Several embodiments of an inductor and a method for fabricating inductors in an integrated circuit have been described. These embodiments are compatible with standard integrated circuit manufacturing processes, and provide flexibility in the selection of conductors and magnetic materials used in the construction of an inductor. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:
1. A method comprising:
forming an inductor including forming a first conductive pattern over a semiconductor substrate and forming a second conductive pattern over the same semiconductor substrate that the first conductive pattern is formed, such that the first and second conductive patterns are arranged in a stack over the same semiconductor substrate, wherein the first conductive pattern is formed such that the first conductive pattern includes an outermost open pattern including outermost segments and an interior area that includes an entire area between the outermost segments of the outermost on pattern and such that the interior area is free of additional portions of the first conductive pattern, and the second conductive pattern is formed such that the second conductive pattern includes an outermost on pattern including outermost segments and an interior area that includes an entire area between the outermost segments of the outermost open pattern of the second conductive pattern and such that the interior area of the second conductive pattern is free of additional portions of the second conductive pattern, and wherein a direction from the interior area of the first conductive pattern to the outermost open pattern of the first conductive pattern is parallel to a surface of the semiconductor substrate, and a direction from the interior area of the second conductive pattern to the outermost open pattern of the second conductive pattern is parallel to a surface of the semiconductor substrate;
forming a conductive path coupled to the first and second conductive patterns;
forming a magnetic material overlying the semiconductor substrate, wherein the magnetic material is formed such that the first conductive pattern directly contacts the magnetic material, and the magnetic material directly contacts the semiconductor substrate;
forming a first additional magnetic material overlying the first conductive pattern after the first conductive pattern is formed;
forming a first hole in the first additional magnetic material to expose a portion of the first conductive pattern at the first hole;
forming a first conductive segment of the conductive path in the first hole, the first conductive segment of the conductive path contacting the portion of the first conductive pattern;
forming a second additional magnetic material overlying the second conductive pattern after the first conductive segment of the conductive path and the second conductive pattern are formed;
forming a second hole in the second additional magnetic material to expose a portion of the second conductive pattern at the second hole;
forming a second conductive segment of the conductive path in the second hole, the second conductive segment of the conductive path contacting the portion of the second conductive pattern; and
forming a third conductive pattern overlying the second additional magnetic material after the second conductive segment of the conductive path is formed, the third conductive pattern is formed such that a portion of third conductive pattern contacts the second conductive segment of the conductive path.
2. The method of claim 1, wherein the first additional magnetic material is between the first and second conductive patterns.

3. The method of claim 2, wherein the first additional magnetic material is formed, such that a portion of the first additional magnetic material fills the interior area of the first conductive pattern.

4. The method of claim 2, wherein the first conductive pattern is formed such that the first conductive pattern includes an outside edge, and the first additional magnetic material is formed such that the first additional magnetic material extends beyond the outside edge of the first conductive pattern.

5. The method of claim 1, wherein:
the first additional magnetic material includes magnetic oxide; and
the second additional magnetic material includes magnetic oxide.

6. The method of claim 1, wherein the second additional magnetic material fills the interior area of the second conductive pattern.

7. The method of claim 1, wherein the third additional magnetic material fills the interior area of the third conductive pattern.

8. The method of claim 1, wherein the second conductive pattern is formed over the first conductive pattern and the semiconductor substrate after the first conductive pattern is formed over the semiconductor substrate.

9. The method of claim 1, wherein the first conductive pattern is formed such that the first conductive pattern includes an outside edge, and the first additional magnetic material is formed such that the first additional magnetic material extends beyond the outside edge of the first conductive pattern.

10. The method of claim 9, wherein the second conductive pattern is formed such that the second conductive pattern includes an outside edge, and the second additional magnetic material is formed such that the second additional magnetic material extends beyond the outside edge of the second conductive pattern.

11. The method of claim 10, wherein the third conductive pattern is formed such that the third conductive pattern includes an outside edge, and the third additional magnetic material is formed such that the third additional magnetic material extends beyond the outside edge of the third conductive pattern.

12. A method comprising:
forming a first conductive pattern of an inductor over a semiconductor substrate, wherein the first conductive pattern is formed such that the first conductive pattern includes outermost segments and an interior area that includes an entire area between the outermost segments, the interior area is free of additional portions of the first conductive pattern, and wherein the outermost segments of the first conductive pattern include a first outermost segment, a second outermost segment, and a third outermost segment contacting the first and second outermost segments, and a direction between the first and second outermost segments of the first conductive pattern is parallel to a surface of the semiconductor substrate;
forming a second conductive pattern of the inductor over the semiconductor substrate after the first conductive pattern is formed, wherein the second conductive pattern is formed such that the second conductive pattern includes outermost segments and an interior area that includes an entire area between the outermost segments, the interior area is free of additional portions of the second conductive pattern, and wherein the outermost segments of the second conductive pattern include a first outermost segment, a second outermost segment, and a third outermost segment contacting the first and second outermost segments, and a direction between the first and second outermost segments of the second conductive pattern is parallel to the surface of the semiconductor substrate;
forming a third conductive pattern of the inductor over the semiconductor substrate after the second conductive pattern is formed, wherein the third conductive pattern is formed such that the third conductive pattern includes outermost segments and an interior area that includes an entire area between the outermost segments, the interior area is free of additional portions of the third conductive pattern, and wherein the outermost segments of the second conductive pattern include a first outermost segment, a second outermost segment, and a third outermost segment contacting the first and second outermost segments, and a direction between the first and second outermost segments of the third conductive pattern is parallel to the surface of the semiconductor substrate;
forming a conductive path coupled to the first, second, and third conductive patterns, wherein the conductive path includes a first segment coupled to a portion of the first conductive pattern and a first portion of the second conductive pattern, and a second segment coupled to a second portion of the second conductive pattern and a portion of the third conductive pattern; and
forming a magnetic material overlying the semiconductor substrate, wherein the magnetic material is formed such that the first conductive pattern directly contacts the magnetic material, and the magnetic material directly contacts the semiconductor substrate.

13. The method of claim 12, further comprising:
forming a first additional magnetic material overlying the first conductive pattern after the first conductive pattern is formed;
forming a first hole in the first additional magnetic material to expose the portion of the first conductive pattern at the first hole; and
forming the first segment of the conductive path in the first hole.

14. The method of claim 13, further comprising:
forming a second additional magnetic material overlying the second conductive pattern after the first segment of the conductive path and the second conductive pattern are formed;
forming a second hole in the second additional magnetic material to expose the second portion of the second conductive pattern at the second hole; and
forming the second segment of the conductive path in the second hole.

15. The method of claim 14, wherein the first additional magnetic material includes magnetic oxide.

16. The method of claim 15, wherein the second additional magnetic material includes magnetic oxide.

* * * * *